US010278285B2

(12) United States Patent
Brunner et al.

(10) Patent No.: US 10,278,285 B2
(45) Date of Patent: Apr. 30, 2019

(54) ELECTRIC COMPONENT ASSEMBLY

(71) Applicant: EPCOS AG, Munich (DE)

(72) Inventors: Sebastian Brunner, Graz (AT); Thomas Feichtinger, Graz (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/422,676

(22) PCT Filed: Aug. 2, 2013

(86) PCT No.: PCT/EP2013/066326
§ 371 (c)(1),
(2) Date: Feb. 19, 2015

(87) PCT Pub. No.: WO2014/029602
PCT Pub. Date: Feb. 27, 2014

(65) Prior Publication Data
US 2015/0245481 A1  Aug. 27, 2015

(30) Foreign Application Priority Data

Aug. 21, 2012 (DE) .................. 10 2012 107 668

(51) Int. Cl.
H05K 1/11 (2006.01)
H01C 1/01 (2006.01)
(Continued)

(52) U.S. Cl.
CPC ............... H05K 1/11 (2013.01); H01C 1/01 (2013.01); H01C 1/084 (2013.01); H01C 7/008 (2013.01);
(Continued)

(58) Field of Classification Search
CPC ........ H05K 1/162–1/167; H05K 1/182; H05K 1/0231; H01L 2924/01078–2924/01079
(Continued)

(56) References Cited

U.S. PATENT DOCUMENTS 5,625,222 A    4/1997 Yoneda et al.
5,821,628 A *  10/1998 Hotta .................. H01L 21/56
                                                  257/666
(Continued)

FOREIGN PATENT DOCUMENTS

CN    101266934 A    9/2008
DE    19746893 A1    5/1999
(Continued)

OTHER PUBLICATIONS

"Heat Sink Embedded LED Package," Kyocera, The New Value Frontier, http://www.kyocera.es/index/products/microelectronic_packages.-cps-00016-File.cpsdownload.tmp/Kyocera+-+Heat+Sink+Embedded+LED+Package.pdf 2011, 1 page.

Primary Examiner — Tuan T Dinh
(74) Attorney, Agent, or Firm — Slater Matsil, LLP

(57) ABSTRACT

A component assembly is disclosed. In an embodiment the assembly includes a carrier, a metallic structure arranged on the carrier, wherein the metallic structure comprises at least one cavity and an electrical component arranged at least in part in the cavity, wherein the metallic structure comprises at least two part regions which are not connected to each other by any further part of the metallic structure, and wherein the cavity is located between the two part regions. The assembly further includes two contact areas located on the carrier, wherein the component is located on the two contact areas such that each part region of the two part regions is located on one of the two contact areas.

8 Claims, 7 Drawing Sheets

(51) Int. Cl.

| | | |
|---|---|---|
| *H01C 1/084* | (2006.01) | |
| *H01C 7/00* | (2006.01) | |
| *H01C 7/02* | (2006.01) | |
| *H01C 7/04* | (2006.01) | |
| *H01C 7/102* | (2006.01) | |
| *H05K 1/03* | (2006.01) | |
| *H05K 1/18* | (2006.01) | |
| *H05K 1/02* | (2006.01) | |

(52) U.S. Cl.
    CPC ............... *H01C 7/02* (2013.01); *H01C 7/04* (2013.01); *H01C 7/102* (2013.01); *H05K 1/0206* (2013.01); *H05K 1/0306* (2013.01); *H05K 1/0313* (2013.01); *H05K 1/116* (2013.01); *H05K 1/181* (2013.01); *H05K 2201/10106* (2013.01)

(58) Field of Classification Search
    USPC ........ 361/760–764, 782–784, 795, 770, 790; 174/259–264, 520–523; 257/685–686, 257/787–790
    See application file for complete search history.

(56) References Cited

U.S. PATENT DOCUMENTS

| | | | | |
|---|---|---|---|---|
| 5,994,771 | A * | 11/1999 | Sasaki | H01L 21/4857 257/700 |
| 6,081,037 | A | 6/2000 | Lee et al. | |
| 6,214,525 | B1 * | 4/2001 | Boyko | H01L 21/486 216/18 |
| 6,284,569 | B1 * | 9/2001 | Sheppard | H01L 21/56 257/E21.502 |
| 6,299,463 | B1 * | 10/2001 | Akram | H01L 23/3677 257/E23.079 |
| 6,645,783 | B1 | 11/2003 | Brunner et al. | |
| 6,734,535 | B1 * | 5/2004 | Hashimoto | H01L 23/13 257/668 |
| 6,759,744 | B2 | 7/2004 | Hirose | |
| 7,335,531 | B2 * | 2/2008 | Iijima | H01L 23/49822 257/E23.062 |
| 7,894,201 | B2 | 2/2011 | Murayama et al. | |
| 8,018,032 | B2 * | 9/2011 | Lu | H01L 21/4846 257/622 |
| 8,085,547 | B2 * | 12/2011 | Wu | H05K 1/183 361/762 |
| 8,531,018 | B2 | 9/2013 | Pahl | |
| 8,803,185 | B2 * | 8/2014 | Ling | H01L 33/62 257/668 |
| 2001/0054751 | A1 * | 12/2001 | Toyosawa | H01L 23/3107 257/668 |
| 2003/0153108 | A1 | 8/2003 | Durocher et al. | |
| 2007/0161266 | A1 * | 7/2007 | Nishizawa | H01L 24/97 439/69 |
| 2008/0049405 | A1 * | 2/2008 | Sahara | H05K 1/183 361/761 |
| 2008/0117607 | A1 | 5/2008 | Murayama et al. | |
| 2008/0224293 | A1 * | 9/2008 | Hin | H01L 21/4832 257/685 |
| 2009/0002969 | A1 * | 1/2009 | Madsen | H01L 23/552 361/818 |
| 2010/0019368 | A1 * | 1/2010 | Shin | H01L 23/24 257/686 |
| 2010/0164092 | A1 | 7/2010 | Lu | |
| 2011/0057273 | A1 | 3/2011 | O'Donnell et al. | |
| 2011/0065241 | A1 * | 3/2011 | Lin | H01L 33/642 438/118 |
| 2013/0220686 | A1 * | 8/2013 | Sahara | H05K 1/183 174/258 |
| 2016/0064310 | A1 * | 3/2016 | Sirinorakul | H01L 23/49541 257/676 |

FOREIGN PATENT DOCUMENTS

| | | |
|---|---|---|
| DE | 10353139 A1 | 6/2005 |
| DE | 102004031685 A1 | 1/2006 |
| DE | 102006017718 A1 | 5/2007 |
| DE | 102010012042 A1 | 9/2011 |
| DE | 102012101560 A1 | 5/2013 |
| EP | 1168445 A1 | 1/2002 |
| EP | 2031952 A1 | 3/2009 |
| JP | S57138392 U | 8/1982 |
| JP | S60200596 A | 10/1985 |
| JP | H04111460 A | 4/1992 |
| JP | H06260736 A | 9/1994 |
| JP | 2000156436 A | 6/2000 |
| JP | 2003124595 A | 4/2003 |
| JP | 2008130934 A | 6/2008 |
| JP | 20119399 A | 1/2011 |
| TW | 200828545 A | 7/2008 |
| TW | 201126688 A | 8/2011 |
| WO | 0148821 A1 | 7/2001 |
| WO | 2006035528 A1 | 4/2006 |

* cited by examiner

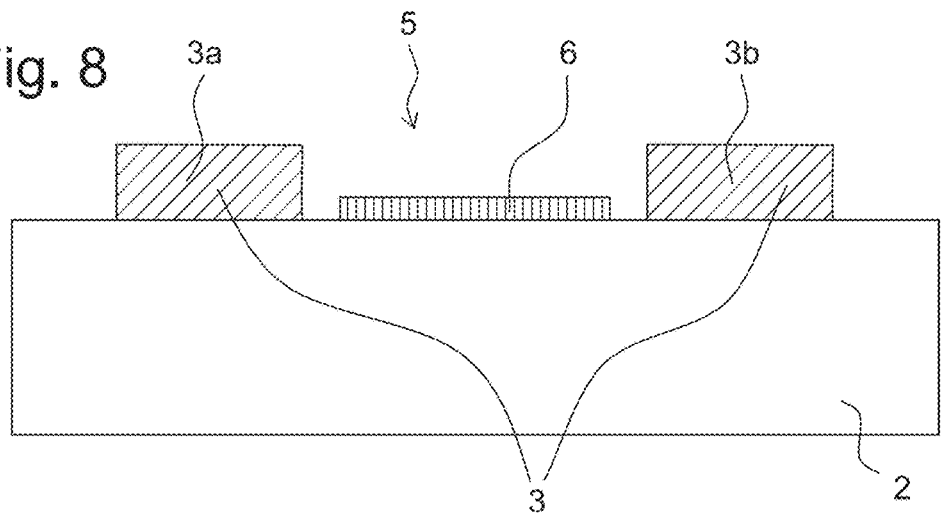
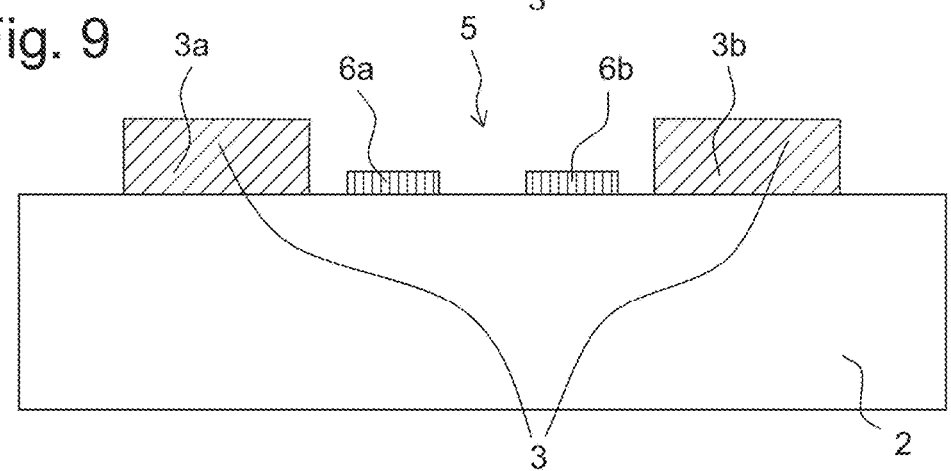
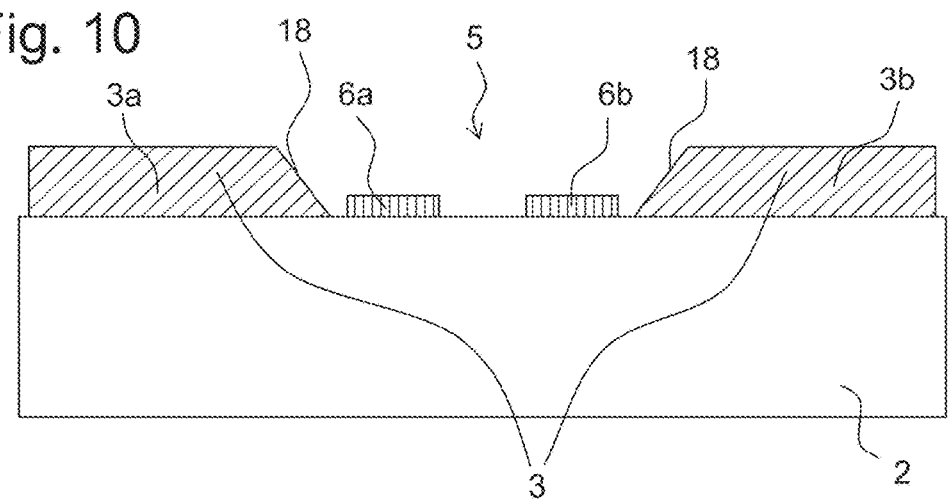

ELECTRIC COMPONENT ASSEMBLY

This patent application is a national phase filing under section 371 of PCT/EP2013/066326, filed Aug. 2, 2013, which claims the priority of German patent application 10 2012 107 668.5, filed Aug. 21, 2012, each of which is incorporated herein by reference in its entirety.

TECHNICAL FIELD

Provided is a component assembly which comprises a carrier and at least one electrical component. For example, the component assembly comprises a light-emitting diode chip.

BACKGROUND

Light-emitting diodes are known where an LED chip and a protective element are arranged on a flat carrier.

SUMMARY OF THE INVENTION

An object is to provide a component assembly with improved characteristics.

Said object is achieved by an object according to the independent claim. Advantageous embodiments and further developments of the object additionally proceed from the dependent claims, the following description and the drawings.

A component assembly with a carrier is provided. The carrier preferably comprises a basic body, in particular an insulating basic body. The outside surfaces of the carrier are preferably free of cavities.

For example, the basic body can comprises a ceramic or an organic material. For example, the basic body comprises at least one of the materials aluminum oxide, aluminum nitride, silicon or LTCC type ceramics (low temperature cofired ceramics) or consists of one of said materials. The carrier can be realized as a printed circuit board. In particular, the carrier can comprise at least one contact face for contacting an electrical component. The contact face can be realized as a metallization of an outside surface of the carrier.

For example, the contact face can be soldered. As an alternative to this or in addition to it, the contact face can be bonded.

The carrier comprises a metallic structure. The metallic structure is preferably arranged on an outside surface of the carrier. The metallic structure comprises at least one cavity. The metallic structure is free of kinks or curves.

The metallic structure can be applied on the carrier by means of electroplating. In particular, a metallic material can be electroplated on the carrier. For example, the metallic material comprises copper or consists of copper. The metallic structure is preferably realized in a layered manner.

The cavity is realized, for example, by an indentation in the metallic structure. The indentation can extend as far as the carrier, for example, as far as the basic body or a contact face of the carrier. In particular, the cavity can be formed by a recess which passes through the metallic structure completely.

At least one electrical component is preferably arranged at least in part in the cavity.

The at least one electrical component is preferably a discrete electrical component. For example, the electrical component is realized as a varistor. In particular, the varistor can be realized in the form of a multiple layer varistor, also called a multi-layer varistor (MLV). For example, the varistor is realized as an ESD protective component. As an alternative to this, the electrical component can also be realized as a TVS diode, as an NTC thermistor component, PTC thermistor component or as a light-emitting diode. The electrical component can also be realized as a chip, in particular as a light-emitting diode chip.

The electrical component is preferably completely recessed in the cavity.

A component being "arranged in a completely recessed manner" in a cavity means, in particular, that the cavity comprises a depth which is greater than or equal to a height of the component which is arranged in the cavity such that there is not any region of the component which projects beyond the cavity.

A particularly compact development of the component assembly is possible when the component is completely recessed. For example, a further element, in particular a further electrical element or a further carrier can be mounted on the metallic structure. As a result of recessing the electrical component completely in the cavity, the further element is able to be arranged above the electrical component on the metallic structure.

The metallic structure can consequently serve in particular as a spacer, also called a "stand-off". In particular, a further element, which is mounted on the carrier, can be arranged at a predetermined spacing from the outside surface of the carrier by means of the metallic structure. The spacing is preferably in such a manner that an electrical component is able to be arranged between the carrier and the further element.

The metallic structure preferably comprises at least two part regions which are separated from one another.

The part regions are arranged, for example, at a spacing from one another. In particular, the cavity can be realized between the part regions. For example, the part regions are separated from one another by a gap. In one embodiment, each part region can comprise a rectangular outer form, for example, with rounded corners.

The part regions preferably comprise planar top surfaces. In particular, the top surface can extend parallel to the outside surface of the carrier. In addition, the top surfaces of the part regions can be free of indentations. Where the part regions comprise planar top surfaces, a further element, in particular a further electrical component or a carrier, can be arranged particularly well on the part regions.

In one embodiment, the metallic structure comprises at least two part regions which comprise the same height. In this case, a further element can be arranged horizontally on the two part regions such that the further element is not inclined in particular in relation to the outside surface of the carrier which faces it.

For example, the carrier can also be mounted on a further carrier or also a further element. The metallic structure can serve for connecting the carrier to the further carrier or to the further element.

The metallic structure can comprise more than two part regions of the same height. For example, the metallic structure comprises three part regions of the same height. In addition, the metallic structure can comprise one or several part regions of other heights along with the part regions of the same height. Consequently, the metallic structure can comprise a step-shaped top surface. For example, the metallic structure comprises two part regions of the same height and a third part region of a lower height. For example, a further component can be mounted onto the third part region. In this case, the third part region including the further component can comprise a smaller height than each of the first and second part regions.

In one embodiment, the metallic structure is connected to at least one electrical contact.

For example, the metallic structure is connected to one or several contact faces of the carrier. In particular, a contact face can be realized as a conducting path. As an alternative to this or in addition to it, the metallic structure can be connected to one or several vias. Via stands for "vertical interconnect access" and designates a through-connection. For example, the carrier comprises a via, the metallic structure being arranged on the via. The via can be connected directly to the metallic structure, for example, or can be connected to the metal structure by means of a contact face.

Where the metallic structure is connected to an electrical contact, the metallic structure can be used to contact a further element electrically, in particular a further electrical component or a carrier, e.g., a printed circuit board. For example, the metallic structure serves for connecting a further element to the carrier both mechanically and electrically. In addition, the metallic structure can also serve as a spacer and/or for heat removal.

For example, the metallic structure is connected to at least two electrical contacts. In particular, the metallic structure can comprise a first part region which is connected to a first electrical contact, and can comprise a second part region which is connected to a second electrical contact. Consequently, the metallic structure can comprise at least one part region which is realized as a cathode and at least one part region which is realized as an anode. The part regions can serve for contacting a further element electrically.

In an alternative embodiment, the metallic structure is not connected to an electrical contact.

In this case, the metallic structure can serve, for example, as a spacer for a further element and/or for heat removal.

In one embodiment, the carrier comprises at least one via.

The via can be realized as a thermal via. A thermal via can improve dissipation of heat. For example, heat can be removed from an electrical component, for example, a light-emitting diode chip, by means of the thermal via. The thermal via preferably comprises a material with good thermal conductivity. For example, the at least one via comprises copper, silver or silver-palladium or consists thereof. The via can be filled completely or in part with a material. For example, the via can be realized as a sleeve. For example, the via can lead through the carrier from a top surface as far as to a bottom surface.

The heat can be removed onto the metallic structure by means of the via. The light-emitting diode chip is arranged, for example, on a top surface of the carrier and is thermally connected to the via. The metallic structure is arranged, for example, on a bottom surface of the carrier and is also connected thermally to the via. Consequently, heat can be removed toward the metallic structure by means of the via. As an alternative to this or in addition to it, the via can be realized for contacting the metallic structure electrically.

The component assembly can comprise several vias, the vias being able to be contacted thermally and/or electrically by part regions of the metallic structure. For example, one or several vias can be contacted thermally only by a first part region. Further vias can be contacted electrically by a second part region.

In one embodiment, the metallic structure comprises several cavities. Electrical components can be arranged in one or in several of the cavities. For example, an electrical component is arranged in each of the cavities. The components are preferably completely recessed in the metallic structure.

In one embodiment, several electrical components can be arranged in one cavity. The electric components are preferably completely recessed in the cavity.

In one embodiment, the cavity is covered at least in part by a further element.

The further element can be realized, for example, as a carrier and/or as an electrical component. The further the element, as described above, can be arranged on metallic structure, in particular on part regions of the metallic structure. The further element can cover the cavity completely. The electrical component can consequently be embedded in the component assembly between the carrier and the further element.

The metallic structure can be realized for contacting the further element electrically. In addition to this or as an alternative to it, the metallic structure can be realized for fastening the further element on the carrier. In particular, the further element can be soldered to the metallic structure.

BRIEF DESCRIPTION OF THE DRAWINGS

The objects described here are explained in more detail below by way of schematic exemplary embodiments that are not true to scale, in which:

FIGS. 8 to 10 show schematic cross sections of different design possibilities of component assemblies.

The same references in the following figures preferably refer to parts of the different embodiments which correspond in a functional or structural manner.

DETAILED DESCRIPTION OF ILLUSTRATIVE EMBODIMENTS

Figure 1:
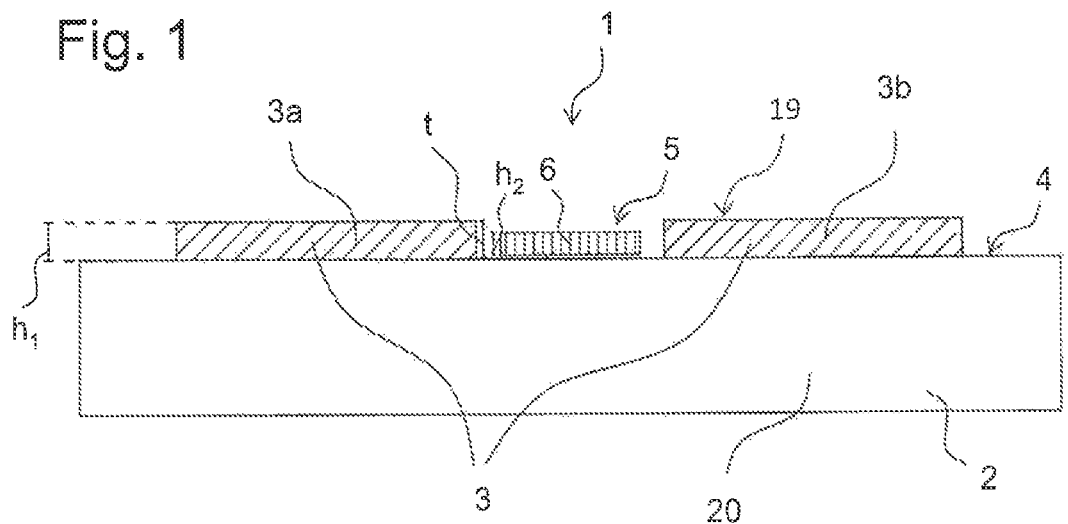
FIG. 1 shows a schematic cross section of a component assembly.

FIG. 1 shows a schematic cross section of a component assembly 1. The component assembly 1 comprises a carrier 2. The carrier 2, in particular a basic body 20 of the carrier, preferably comprises an electrically insulating material. For example, the carrier 2 comprises a ceramic material or an organic material.

The carrier 2 comprises a metallic structure 3, in particular a layered metallic structure 3, on a first outside surface 4. The metallic structure 3 is formed, for example, by means of electroplating.

The top surface 19 of the metallic structure 3 remote from the carrier 2 extends parallel to the first outside surface 4 of the carrier. For example, the first outside surface 4 is a bottom surface of the carrier 2. The metallic structure 3 comprises, in particular, a planar top surface 19 which makes it possible to locate the carrier evenly or to arrange a further element evenly on the top surface 19.

For example, the structure 3 comprises copper. In addition, the metallic structure 3 can be provided with a thin layer, for example, a gold layer, on a top surface for improving the solderability. The structure can comprise, for example, a height within the range of between 80 µm and 90 µm. In this case, the height is preferably chosen in such a manner that an electrical component is able to be completely embedded into the metallic structure. For example, the height can also be within the range of 120 µm. The structure 3 can be realized in a completely metallic manner.

The structure 3 comprises several part regions 3a, 3b which are separated from one another. The part regions 3a, 3b are realized in each case in a layered manner and comprise the same height $h_1$ which corresponds to the height of the structure. For example, the part regions 3a, 3b are realized as contact pads.

A cavity 5, in which an electrical component 6 is arranged, is situated between the part regions 3a, 3b. The electrical component 6 is completely recessed in the cavity 5 such that the top surface of the component 6, which points away from the carrier 2, does not project beyond the metallic structure 3. The height $h_2$ of the component 6 is in particular smaller than the depth t of the cavity 5.

The electrical component 6 is a discrete component. For example, the electrical component 6 is realized as a varistor. In particular, the varistor can be realized in the form of a multiple layer varistor, also called a multi-layer varistor (MLV). For example, the varistor is realized as an ESD protective component. As an alternative to this, the electrical component 6 can also be realized as a TVS diode, as an NTC thermistor component, PTC thermistor component or as a light-emitting diode. The electrical component 6 can also be realized as a chip, in particular as a light-emitting diode chip.

The electrical component 6 is preferably realized in an ultrathin manner. In particular, the electrical component 6 can comprise a height of less than 100 µm, for example, a height of 80 µm. In a corresponding manner, the cavity can comprise a depth t of less than 150 µm, for example, of 120 µm. The depth t of the cavity 5 can correspond to the height of the metallic structure 3.

Figure 2:
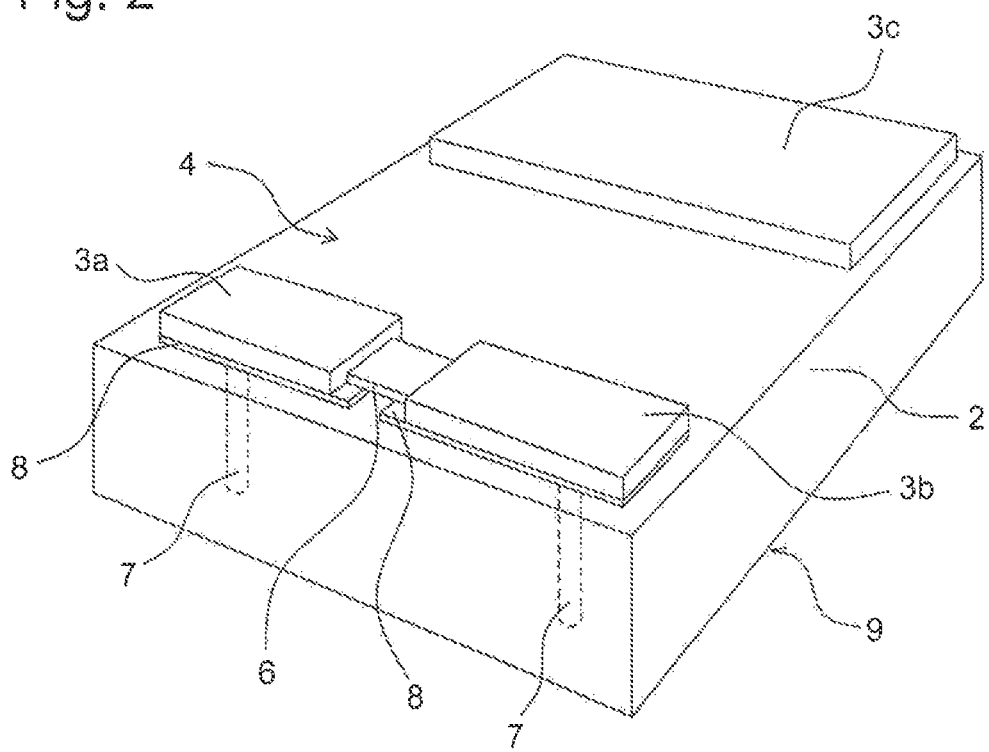
FIG. 2 shows a perspective view of the component assembly from FIG. 1.

FIG. 2 shows a perspective view of the component assembly from FIG. 1. The carrier 2 is provided with contact faces 8 (not shown in FIG. 1), on which the part regions 3a, 3b of the metallic structure 3 of the carrier 2 are mounted. The contact faces 8 are preferably thin metallic layers and can comprise in particular copper with a thin gold layer for improving the solderability. For example, the contact faces 8 comprise thicknesses within the range of 20 µm. The electrical component 6 is also mounted on the contact faces 8. The component 6 is preferably soldered on the contact faces 8.

Vias 7, i.e., through-connections, are arranged in the carrier 2. The vias 7 serve for contacting the contact faces 8 electrically. In addition, the vias 7 can also be realized as thermal vias and serve for heat removal. The part regions 3a, 3b are contacted electrically in each case by a via 7. Consequently, the part regions 3a, 3b can be used for contacting a further element.

The vias 7 comprise, for example, copper. As an alternative to this, the contact faces 8 can also comprise other materials with a high degree of thermal conductivity, such as, for example, silver or silver palladium.

The metallic structure 3 comprises a third part region 3c (not shown in FIG. 1). Said part region 3c can also serve, for example, for contacting electrically and/or for heat removal and can be connected to electrical and/or thermal vias. Said part region 3a is preferably not contacted electrically and in particular is insulating with respect to thermal vias adjoining thereto. For example, the part region 3a is realized as a thermally conductive pad.

For example, a heat-generating component is arranged on a second outside surface 9 of the carrier 2 which is located opposite the first outside surface 4. This can be a light-emitting diode chip 4 in particular. Vias which lead through the carrier 2 can remove the heat through the carrier 2 to the third part regions 3c. For example, the second outside surface 9 is a top surface of the component assembly 1.

The third part region 3c comprises the same height as the first and second part regions 3a, 3b. Consequently, a further element can be arranged horizontally on the three part regions 3a, 3b, 3c.

FIGS. 3A to 3G show schematic cross sections of method steps when producing a component assembly.

Figure 3A:
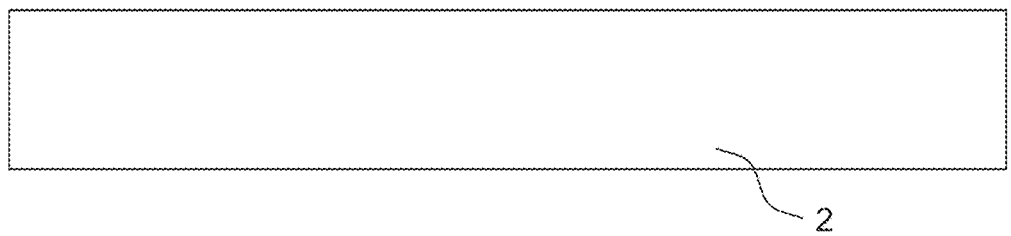
FIGS. 3A to 3G show schematic cross sections of method steps during the production of a component assembly.
Figure 3B:
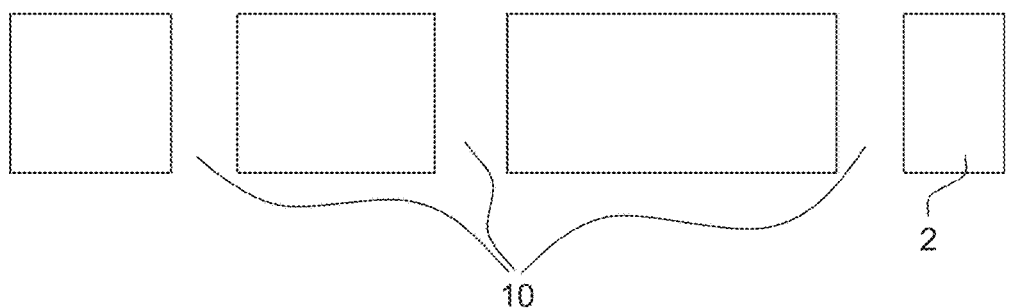
Figure 3C:
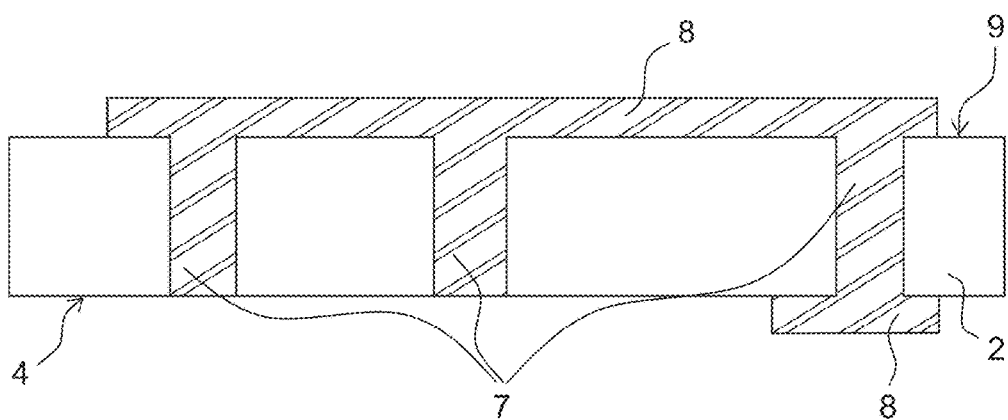
Figure 3D:
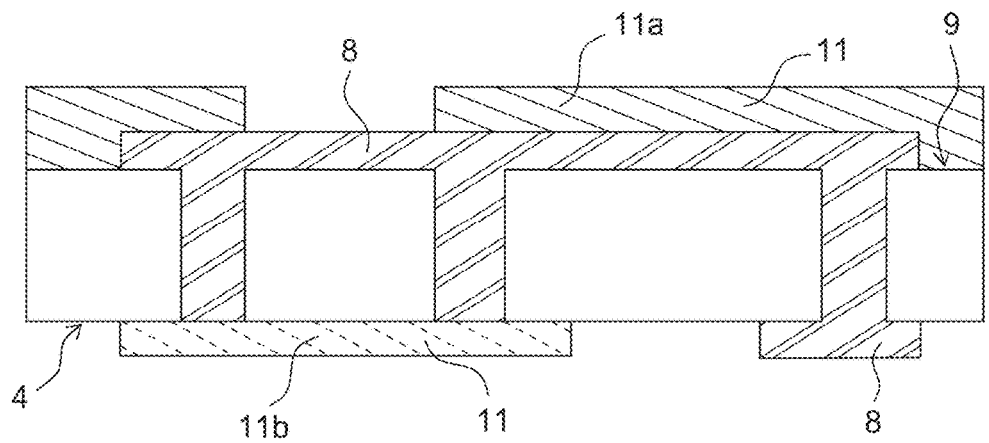
Figure 3E:
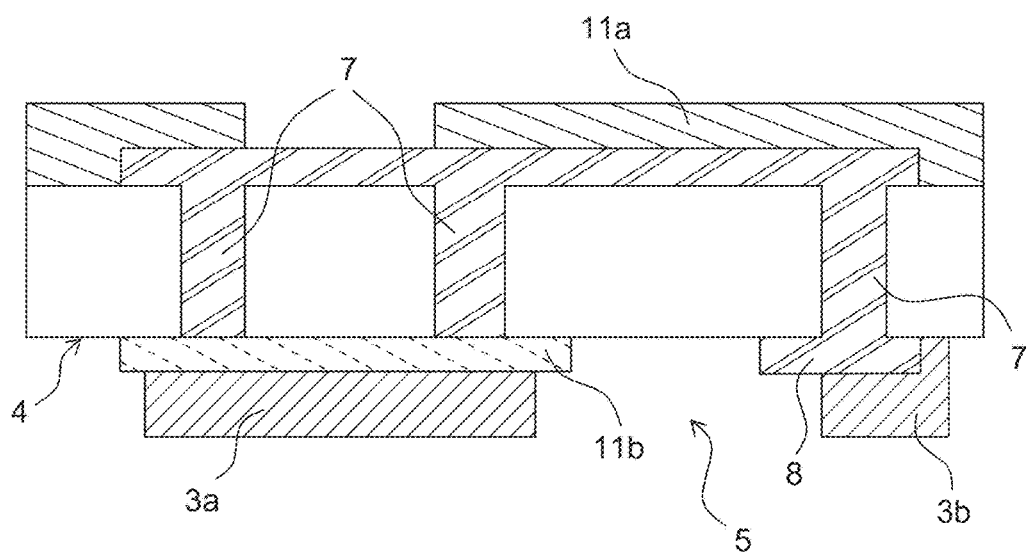
Figure 3F:
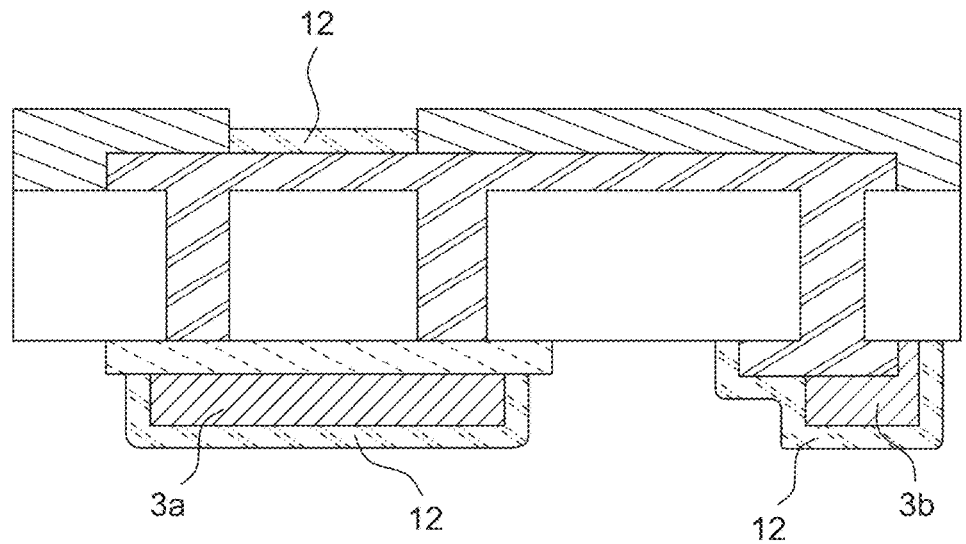
Figure 3G:
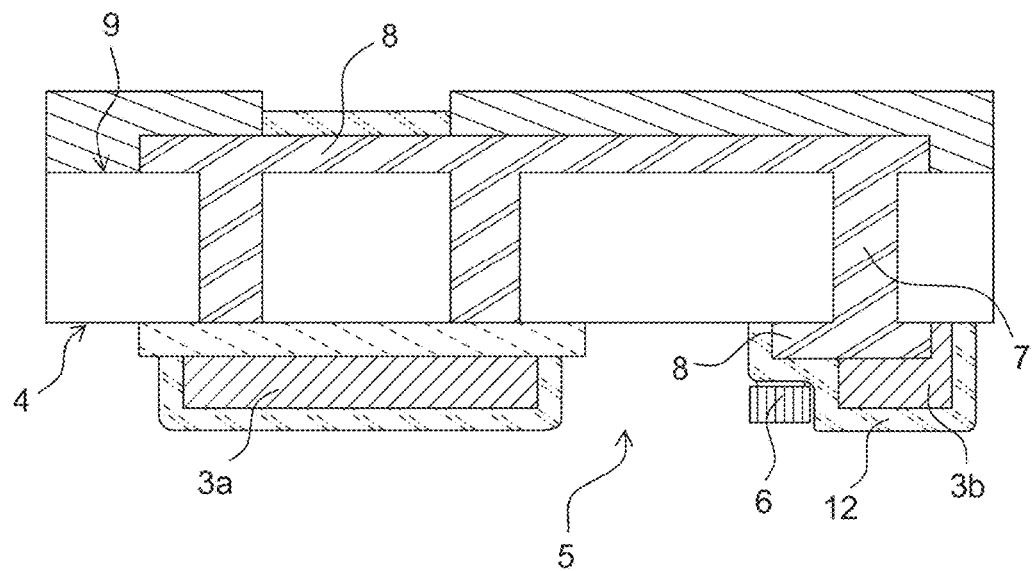

The resulting component assembly shown in FIG. 3G is a further example of a component assembly and differs from the component assembly shown in FIGS. 1 and 2 in the specific arrangement of the different component parts, but the method can be applied analogously to the production of the component assembly shown in FIGS. 1 and 2 and to the component assembly shown in the following figures.

A carrier 2 is prepared according to FIG. 3A. The carrier 2 is preferably realized from an insulating material, in particular the carrier 2 can be realized as described in conjunction with FIGS. 1 and 2.

According to FIG. 3B, in a connecting method step through-holes 10 are provided, for example, stamped, in the carrier 2 for realizing vias. This can be affected, for example, in a mechanical manner, in particular with pins, or with a laser.

According to FIG. 3C, the through-holes 10 are filled with a metallic material such that vias 7 are formed. In addition, contact faces 8 are mounted on first and second outside surfaces 4, 9 of the carrier 1 such that the contact faces 8 are contacted by the vias 7. In particular, the contact faces 8 can be mounted using a screen printing method. The contact faces 8 comprise, for example, copper or silver. For example, the contact faces comprise a height of about 20 µm.

According to FIG. 3D, electrical insulation 11 is applied on parts of the contact faces 8 and outside surfaces 4, 9 of the carrier 2. The insulation 11 is realized in a layered manner. The insulation 11 can be applied in a first step in such a manner that the contact faces 8 and the outside surfaces 4, 9 of the carrier 2 are completely covered by the insulation 11. The insulation 11 can then be structured in such a manner that part regions of the contact faces 8 and/or of the outside surfaces 4, 9 of the carrier 2 are exposed. The exposed regions of the contact faces 8 serve, for example, for contacting an electrical component.

For example, a first insulation 11a is applied onto a contact face 8 which is arranged on a second outside surface 9. The first insulation 11a comprises, for example, a proportion of glass and can be imprinted as glass paste. As an alternative to this, the first insulation 11a can comprise silicon nitride ($Si_3N_4$) or aluminum nitride (AlN) and can be applied, for example, using plasma-enhanced chemical vapor deposition or using reactive sputtering. The first insulation 11a can then be structured by means of an etching mask.

A second insulation 11b is applied on a contact face which is arranged on a first outside surface 4. The second insulation 11b comprises a material with a high degree of thermal conductivity. For example, the second insulation 11b comprises aluminum nitride. The second insulation 11b can be deposited.

According to FIG. 3E, a metallic structure 3 is then applied, in particular electroplated, on the first outside surface 4. For example, the method of a semi-additive coating can be applied for this purpose where a structured resist, e.g., photoresist, is applied on a seed layer. As an alternative to this, a copper layer can be applied, provided with a structured acid resist and then be subtractively etched.

The metallic structure 3 comprises a first and a second part region 3a, 3b. The first part region 3a is arranged on the second insulation 11b such that no electrical contact to the contact faces 8 is produced. On account of the high degree of thermal conductivity of the second insulation 11b, heat can be removed from the vias 7 that are arranged above the first part region 3a to the first part region 3a.

In addition, a second part region 3b of the metallic structure 3 is applied onto an exposed contact face 8 on the first outside surface 4. The second part region 3b is in electrical contact with the via 7 that is arranged above it. The second part region 3b can serve for electrically contacting a further element which can be arranged on the second part region 3b.

The second part region 3b covers the contact face 8, with which it is in electrical contact, only in part such that a region of the contact face 8 is exposed. Said region of the contact face 8 can be utilized for contacting a component.

In the alternative embodiments, for example, several or all of the part regions 3a, 3b can be electrically contacted. As an alternative to this, it is also possible for none of the part regions 3a, 3b to be electrically contacted.

The part regions 3a, 3b are spaced apart from one another such that a cavity 5 is realized between the part regions 3a, 3b.

According to FIG. 3F, the exposed regions of the contact faces 8 as well as the part regions 3a, 3b of the metallic structure 3 are provided with a thin metallic layer 12. The layer 12 is, for example, a thin gold layer and can serve for improving solderability. As an alternative to this, the layer 12 can comprise nickel-palladium-gold or Ni-gold. The thin layer 12 can be seen as a component part of the part regions 3a, 3b of the metallic structure.

According to FIG. 3G, an electrical component 6, in particular a discrete electrical component 6, is then arranged in the cavity 5. The electrical component 6 is arranged directly next to the second part region 3b. The electrical component 6 is arranged on part of the contact face 8 which is contacted by the second part region 3b and is not covered by the second part region 3b. The electrical component 6 is in electrical contact with the contact face 8 and the via 7 which is arranged above it.

For example, the component 6 is soldered on the contact face 8, in particular on the thin layer 12 of the contact face 8. As an alternative to this, the component 6 can also be glued on, in particular using a conductive adhesive. A conductive adhesive containing silver is used for this purpose, for example. As an alternative to this, the component 6 can also be bonded onto the contact face 8. For example, the component 6 can be connected to the contact face 8 by means of thermosonic bonding, thermocompression bonding or an ultrasonic flip chip gold-to-gold interconnect.

The electrical component 6 is completely recessed in the cavity 5 in the present case such that it does not project beyond the metallic structure 3 comprising the thin layer 12.

One or several further components can be mounted on the second outside surface 9 of the carrier. For example, a further component, such as, for example, a light-emitting diode chip, can be arranged on the contact face 8, which is provided with a thin layer 12, and can be electrically contacted. The first part region 3a can serve for removing heat that is generated in the further component.

The further FIGS. 4 to 10 show exemplary embodiments and design possibilities of a component assembly which are modifications and variants of the exemplary embodiments shown in FIGS. 1, 2 and 3G and which consequently will be explained above all with regard to the differences hereto.

Figure 4:
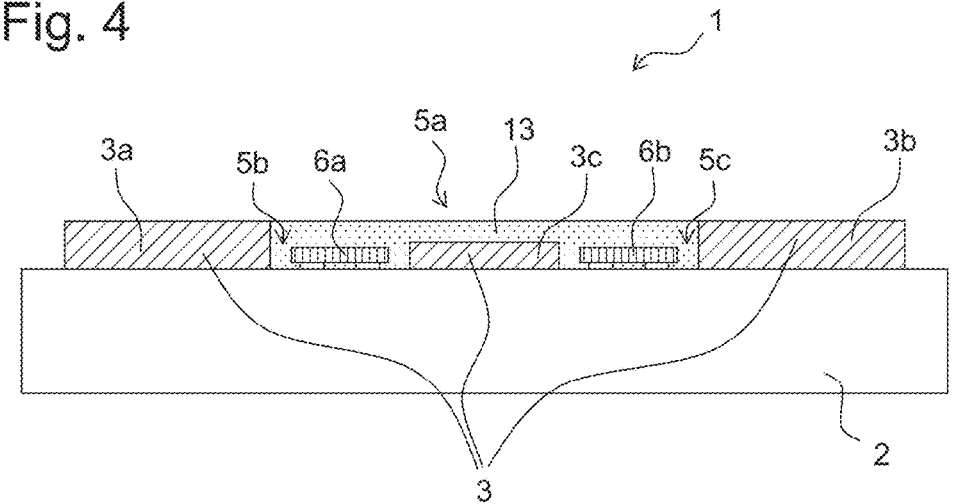
FIGS. 4 to 7 show schematic cross sections of further component assemblies.

In the case of the component assembly 1 shown in FIG. 4, a metallic structure 3 including three part regions 3a, 3b, 3c is arranged on a carrier 2. It can be possible to contact the metallic structure 3 electrically or it cannot be possible to contact it electrically.

A cavity 5a is realized between a first and a second part region 3a, 3b. A third part region 3c of the metallic structure 3 is arranged in the cavity 5a. The third part region 3c comprises a smaller height than the first and the second part regions 3a, 3b. Cavities 5b, 5c are realized between the first part region 3a and the third part region 3c as well as between the second part region 3b and the third part region 3c. The cavities 5b and 5c can also be seen as part regions of the cavity 5a.

One electrical component 6a, 6b is arranged in each case in the cavities 5b, 5c. The cavities 5a, 5b, 5c are filled with a protective material 13, in particular an insulating material. The protective material 13 can be realized as a protective coating. As an alternative to this or in addition to it, the cavities 5a, 5b, 5c can be filled with a material for light conversion. For example, the protective material 13 can also serve for light conversion. In particular, blue light generated by an LED can be converted into white light. A phosphorous material is used for this purpose, for example.

Each of the three part regions 3a, 3b, 3c can serve, for example, for contacting an electrical element or for heat removal.

Figure 5:
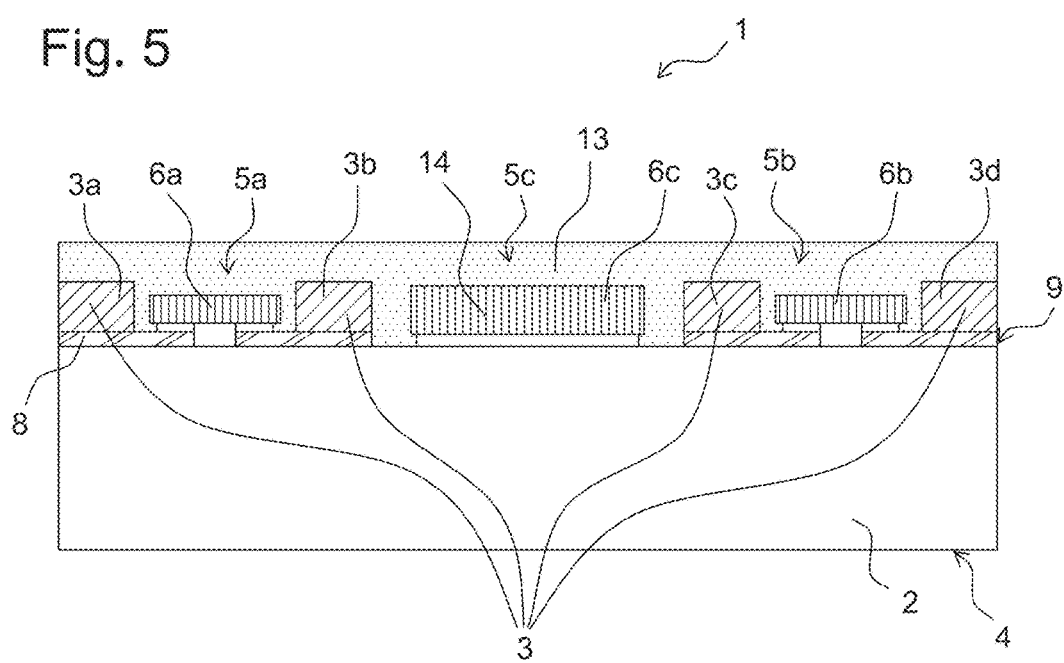

In the case of the component assembly 1 shown in FIG. 5, the metallic structure 3 includes four part regions 3a, 3b, 3c, 3d which are separated from one another. A first cavity 5a, in which a first electrical component 6a is arranged, is situated between the first and the second part regions 3a, 3b. A second cavity 5b, in which a second electrical component 6b is arranged, is situated between the third and the fourth part regions 3c, 3d. The first and second electrical components 6a, 6b are arranged on contact faces 8 and are contacted electrically by means of the contact faces 8. The part regions 3a, 3b, 3c, 3d of the metallic structure 3 are also arranged on the contact faces 8 and are electrically contacted by the contact faces 8.

In addition, a third component 6c, in particular a chip 14, is arranged on the carrier 2. The chip 14 is, for example, a light-emitting diode chip. The chip 14 is arranged in a third cavity 5c which is formed by the second and third part regions 3b, 3c of the metallic structure 3. The chip 14 can be contacted electrically, for example, by means of contact faces, vias or wiring.

In the case of the exemplary embodiment shown here, the electrical components 6a, 6b and the chip 14 are arranged on the same outside surface 9 of the carrier 2. The outside surface 9 is preferably a top surface of the carrier 2. Consequently, for example, in the case of a third component 6c which is realized as a light-emitting diode chip, light is able to be emitted upward. The recessing of the electrical components 6a, 6b in the cavities 5a, 5b prevents light emitted from the light-emitting diode chip being shadowed by the further electrical components 6a, 6b.

The side faces of the part regions 3c, 3b which define the cavity 5c in which the chip 14 is arranged, are preferably reflective. A light yield can consequently be improved.

The metallic structure 3 preferably comprises a high degree of thermal conductivity. The advantage of this is that heat generated in operation is easy to remove. As a result, the component assembly 1 comprises good thermal management. The service life of the component assembly 1 can be significantly extended by a reduced thermal load.

The cavities 5a, 5b, 5c are filled with a protective material 13. The protective material 13 completely covers the metallic structure 3 and the components 6a, 6b, 6c. In particular, the protective material 13 forms a protective coating on the component assembly 1.

Figure 6:
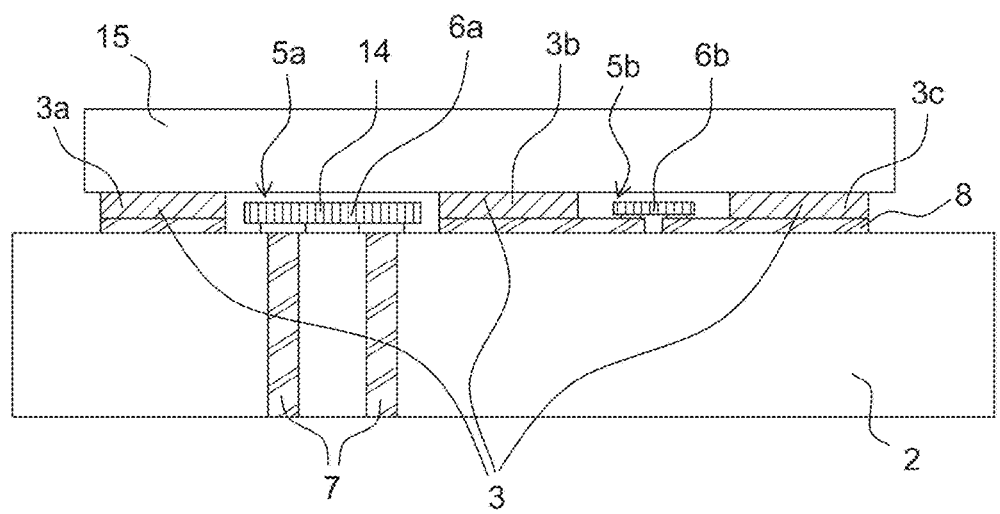

The component assembly 1 shown in FIG. 6 comprises a carrier 2 on which a metallic structure 3 including a first, second and third part region 3a, 3b, 3c is arranged. The second part region 3b is arranged between the first and the third part region 3a, 3c. All the part regions 3a, 3b, 3c comprise the same height.

A first component 6a is arranged in a first cavity 5a of the metallic structure 3. The first component 6a can be realized as a chip, for example, as a light-emitting diode chip. The first component 6a is contacted by means of vias 7. The vias 7 can be realized as thermal and/or electrical vias. A second component 6b which is contacted electrically by means of contact faces 8 is arranged in a second cavity 5b.

A further element 15 is arranged on the metallic structure 3. The further element 15 covers the components 6a, 6b which are arranged in the cavities 5a, 5b. Consequently, the components 6a, 6b are embedded in the cavities 5a, 5b between the carrier 2 and the further element 15.

The further element 15 is fastened, for example, soldered, on the metallic structure 3. Consequently, the metallic structure 3 serves, in particular, for fastening the further element 15. In addition, the metallic structure 3 also serves for contacting the further element 15 electrically. In addition to this or as an alternative to it, heat can also be transferred between the further element 15 and the carrier 2 by means of the metallic structure 3.

The further element 15 forms a second plane of the component assembly. The carrier 2 with the components 6a, 6b arranged thereon can be seen as a first plane of the component assembly 1.

Using the assembly shown, components 6a, 6b can be accommodated in a space-saving manner in the component assembly 1 as they are recessed in cavities 5a, 5b which are arranged between the planes.

The further element 15 is realized, for example, as a carrier. In particular, further components can be mounted on the further element 15. The further element 15 can also be realized as a chip, in particular as a light-emitting diode chip.

Figure 7:
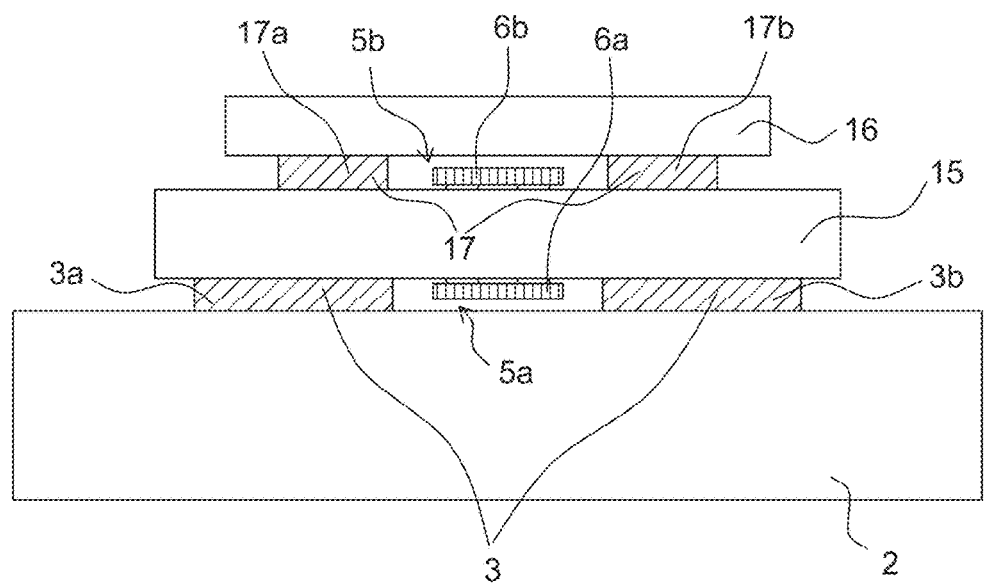

FIG. 7 shows a component assembly 1 with three planes. A first further element 15 is arranged on a carrier 2, which forms a first component plane, and a second further element 16 is arranged thereon. The first further element 15 forms a second component plane and the second further element 16 forms a third component plane.

The first further element 15 is electrically and mechanically connected to the carrier 2 by means of a metallic structure 3 comprising two part regions 3a, 3b. The second further element 16 is electrically and mechanically connected to the first further element 15 by means of a further metallic structure 17, comprising two part regions 17a, 17b. The metallic structures 3, 17 can comprise the structural and functional characteristics as are described in conjunction with FIG. 6. The further elements 15, 26 can be realized, for example, as electrical components. The further elements can be realized as a chip, in particular as a light-emitting diode chip or as a carrier. In particular, the second further element 16 can be realized as a light-emitting diode chip.

Cavities 5a, 5b are realized in each case in the metallic structures 3, 17. A first electrical component 6a is embedded in the cavity 5a of the first metallic structure 3 and a second electrical component 6b is embedded in the cavity 5b of the second metallic structure 17. In the present example, both electrical components 6a, 6b are fastened on the first further element 15. As an alternative to this, the first component 6a can be fastened on the carrier 2. The second component 6b can be arranged as an alternative to this on the second further element 16.

FIGS. 8 to 10 show different design possibilities of metallic structures 3 and possible arrangements of discrete components 6a, 6b in component assemblies 1. The previously described exemplary embodiments of the component assemblies 1 can be converted in a corresponding manner.

FIG. 8 shows an embodiment of a component assembly 1 where a discrete component 6 is arranged in a cavity 5 of a metallic structure 3. The component 6 is completely recessed in the cavity 5.

FIG. 9 shows an embodiment of a component assembly 1 where two discrete components 6a, 6b are arranged in a cavity 5. The components 6a, 6b are completely recessed in the cavity 5.

FIG. 10 shows an embodiment of a component assembly 1 where the metallic structure 3 comprises beveled side faces 18. This can lead, for example, to an improvement in the thermal characteristics. For the case where at least one of the components 6a, 6b is realized as a light-emitting diode chip, improved emission characteristics can be obtained as a result.

The invention claimed is:

1. A component assembly comprising:
    a carrier comprising an electrically insulating material, wherein the electrically insulating material forms a planar surface;
    a metallic structure arranged on the planar surface of the carrier such that the metallic structure is neither partially nor fully embedded in the electrically insulating material of the carrier, wherein the metallic structure defines at least one cavity such that a surface of an inner wall of the cavity is formed by the metallic structure; and
    an electrical component arranged at least in part in the cavity,
    wherein the metallic structure comprises at least two part regions which are not connected to each other by any further part of the metallic structure,
    wherein the cavity is located between the two part regions,
    wherein a thickness of the metallic structure in a direction perpendicular to the planar surface of the electrically insulating material is larger than a height of the electrical component in the direction perpendicular to the planar surface of the electrically insulating material, and
    wherein the metallic structure is neither in electrical connection with the electrical component arranged at least in part in the cavity nor in electrical connection with any further electrical component of the component assembly.

2. The component assembly according to claim 1, wherein the electrical component is a thermistor element, varistor element, TVS diode or light-emitting diode.

3. The component assembly according to claim 1, wherein the electrical component is a chip.

4. The component assembly according to claim 1, wherein the carrier comprises a ceramic or an organic material.

5. The component assembly according to claim 1,
wherein the cavity is at least partially covered at least in part by a further element, wherein the further element is located on the metallic structure,
wherein the carrier has a plain outer surface, and
wherein the metallic structure and the electrical component are located on the plain outer surface.

6. The component assembly according to claim 1, wherein a width of each of the part regions is larger than a width of the electrical component such that the two part regions laterally project over the electrical component.

7. The component assembly according to claim 5, wherein the further element is a further electrical component or a further carrier.

8. The component assembly according to claim 5, wherein the metallic structure fastens the further element on the carrier.

\* \* \* \* \*